(12) United States Patent
Mukhopadhyay et al.

(10) Patent No.: US 11,848,552 B2
(45) Date of Patent: *Dec. 19, 2023

(54) USB TYPE-C/PD CONTROLLER HAVING INTEGRATED VBUS TO CC SHORT PROTECTION

(71) Applicant: TEXAS INSTRUMENTS INCORPORATED, Dallas, TX (US)

(72) Inventors: Rajdeep Mukhopadhyay, Karnataka (IN); Pulkit Shah, Karnataka (IN); Vinod Joseph Menezes, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/738,828

(22) Filed: May 6, 2022

(65) Prior Publication Data

US 2022/0263309 A1   Aug. 18, 2022

Related U.S. Application Data

(63) Continuation of application No. 17/078,425, filed on Oct. 23, 2020, now Pat. No. 11,355,918, which is a (Continued)

(51) Int. Cl.
*H02H 3/26* (2006.01)
*H03K 17/687* (2006.01)
(Continued)

(52) U.S. Cl.
CPC .......... *H02H 3/26* (2013.01); *G06F 13/4081* (2013.01); *H03K 5/24* (2013.01); *H03K 17/687* (2013.01);
(Continued)

(58) Field of Classification Search
CPC .......... G06F 2213/0042; G06F 13/382; G06F 13/4081; G06F 13/4295; H02H 9/02;
(Continued)

(56) References Cited

U.S. PATENT DOCUMENTS 9,727,123 B1   8/2017 Nayak
9,800,233 B1   10/2017 Abu
(Continued)

FOREIGN PATENT DOCUMENTS

CN   103647339 A   3/2014
CN   203690882 U   7/2014
(Continued)

OTHER PUBLICATIONS

European Search Report dated Apr. 19, 2021.
Corresponding China Application No. 201980029903.3, First Office Action dated Jan. 19, 2023, 11 pgs.

*Primary Examiner* — Alex Torres-Rivera
(74) *Attorney, Agent, or Firm* — John R. Pessetto; Frank D. Cimino

(57) ABSTRACT

A USB Type-C/Power Delivery controller chip includes a first pin for receiving a first voltage, a second pin for receiving a second voltage, and a third pin for coupling to the CC pin of a USB connector. The USB controller chip includes a VCONN power supply circuit having a blocking field effect transistor (BFET) coupled in series with a hot-swap field FET (HSFET) between the first and third pins, and first and second Zener diodes coupled anode-to-anode between the HSFET's source and gate. A cable detection circuit includes a BFET coupled between the second and third pins, and a Zener diode coupled between the BFET's gate and a lower rail. A power delivery physical layer circuit includes a receiver and a transmitter, each coupled to the third pin through a respective BFET, the
(Continued)

respective BFETs each having a Zener diode coupled between respective gates and the lower rail.

16 Claims, 8 Drawing Sheets

Related U.S. Application Data continuation of application No. 15/955,214, filed on Apr. 17, 2018, now Pat. No. 10,855,069.

(51) Int. Cl.
    *G06F 13/40*     (2006.01)
    *H03K 5/24*     (2006.01)
    *H01R 13/66*     (2006.01)
    *H02H 9/02*     (2006.01)
    *H02H 9/04*     (2006.01)

(52) U.S. Cl.
    CPC .. *G06F 2213/0042* (2013.01); *H01R 13/6675* (2013.01); *H02H 9/02* (2013.01); *H02H 9/04* (2013.01)

(58) Field of Classification Search
    CPC .. H02H 9/04; H02H 3/26; H03K 5/24; H03K 17/687; H01R 13/6675
    See application file for complete search history.

(56) References Cited

U.S. PATENT DOCUMENTS

| | | |
|---|---|---|
| 10,289,589 B2 * | 5/2019 | Chhor ................ G06F 13/4022 |
| 10,320,180 B1 | 6/2019 | Venigalla |
| 2010/0073837 A1 | 3/2010 | Predtetchenski |
| 2013/0107409 A1 * | 5/2013 | McGee ................ H02H 9/02 361/91.1 |
| 2015/0346790 A1 | 12/2015 | Talmola |
| 2016/0188514 A1 | 6/2016 | Forghani-Zadeh |
| 2016/0190794 A1 | 6/2016 | Forghani-Zadeh |
| 2017/0060216 A1 | 3/2017 | Waters |
| 2017/0155214 A1 | 6/2017 | Shen |
| 2017/0351638 A1 | 12/2017 | Chen |
| 2018/0060261 A1 | 3/2018 | Chhor |
| 2018/0188799 A1 | 7/2018 | Nge |
| 2018/0287366 A1 | 10/2018 | Yeh et al. |
| 2019/0286597 A1 | 9/2019 | Chiba |
| 2019/0319446 A1 | 10/2019 | Mondal |

FOREIGN PATENT DOCUMENTS

| | | |
|---|---|---|
| CN | 204131110 U | 1/2015 |
| CN | 204681073 U | 9/2015 |
| CN | 110417085 A | 11/2019 |
| WO | 20170204970 A1 | 11/2017 |

\* cited by examiner

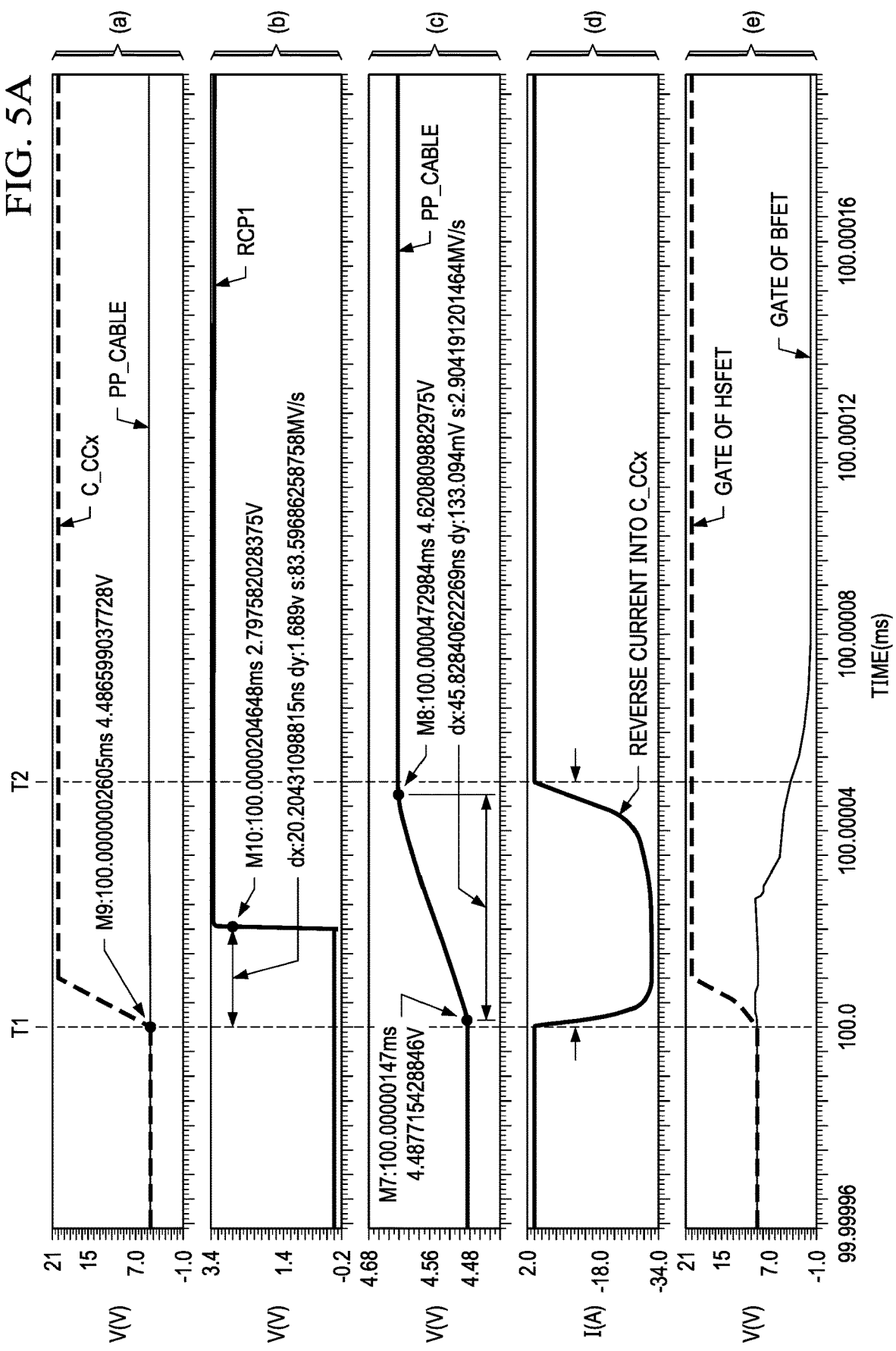

USB TYPE-C/PD CONTROLLER HAVING INTEGRATED VBUS TO CC SHORT PROTECTION

CROSS-REFERENCE TO RELATED APPLICATIONS

This application is a continuation of prior application Ser. No. 17/078,425, filed Oct. 23, 2020, currently pending, which is a continuation of prior application Ser. No. 15/955,214, filed Apr. 17, 2018, currently patented (U.S. Pat. No. 10,855,069 issued Dec. 1, 2020).

FIELD OF THE DISCLOSURE

Disclosed embodiments relate generally to the field of Universal Serial Buses (USBs). More particularly, and not by way of any limitation, the present disclosure is directed to a USB Type-C/Power Delivery (PD) controller having integrated virtual bus (VBUS) to configuration control (CC) short protection.

BACKGROUND

The latest generation of USB cables is designed with increased capabilities in the delivery of both power and data and greater flexibility in the protocol. The number of pins on the USB connectors has increased while the size of the USB connectors themselves has decreased to enable use of the cables with increasingly thin devices. FIG. 1 depicts a schematic diagram showing the arrangement of the pins in a USB Type-C connector 100, which is compatible with USB 2.0, USB 3.0 and USB 3.1 devices. Pins A1, A12, B1, and B12 all provide ground connections. Pins A2, A3, A10, A11, B2, B3, B10 and B11 are utilized for USB 3.1 super speed communications at 10 Gbps while pins A6, A7, B6, B7 are utilized for USB 2.0 high speed communications at 480 Mbps. VBUS pins A4, A9, B4, B9 can provide a negotiated power supply of up to 20V DC. CC pins A5, B5 are utilized for power deliver communications and can also provide a 5V power supply to power an integrated circuit within an electronically marked Type-C cable while side band use (SBU) pins A8 and B8 can be utilized in Alternate Mode for Type-C cables.

Given the small form factor of the USB Type-C connectors in combination with uncontrollable factors, e.g., the angle of insertion of a cable into a USB Type-C connector, the quality of the cable itself and possible contamination of either the USB connector or plug, the fact that each 5V CC pin is adjacent to a 20V VBUS pin means that the 5V circuitry associated with the CC pin must be protected against a short to the higher voltage VBUS pin. Solutions that have worked in earlier versions of USB either do not provide the needed level of protection, provide more interference with the communications protocol than can be tolerated or have additional resistance and/or leakage issues. Further improvements are needed.

SUMMARY

Disclosed embodiments provide at least three levels of protection against a short. In a first level of protection, blocking transistors, also referred to as blocking field-effect transistors (BFETs), in each of the protected pathways are protected by Zener diodes to prevent damage to the gate oxide from a hard short, e.g., having an edge rate greater than 22V/10 ns. In a second level of protection, fast reverse current protection (RCP) comparators are used to trigger turning OFF the BFETs when excessive reverse current is detected; the turning OFF occurs in less than 100 ns to prevent device damage. In a third level of protection, over-voltage protection (OVP) comparators compare the voltage on the CC pin to reference voltages set with respect to ground and can trigger the BFETs to be turned OFF in soft short situations where, e.g., the edge rate is less than 22V/100 µs and the RCP comparators may not trip or not trip quickly enough. Each of the BFETs can also be turned OFF by a dead-battery transistor coupled to the gate of the blocking FET, with the dead-battery transistor coupling the gate of the respective blocking FET to ground when a battery on the host device is unable to supply power to the protection circuitry; the dead-battery circuitry provides this protection by pulling power from the short on the CC line. Protections are also disclosed in a dynamic hot swap keep-off circuit that provides multiple pathways to couple the gate and source of a hot-swap field effect transistor (HSFET) during a short in order to protect the gate oxide; these pathways do not cause interference with the communications that occurs on the CC line.

In one aspect, an embodiment of a USB Type-C/PD controller chip is disclosed. The USB Type-C/PD controller chip includes a first pin for coupling to receive a first voltage from a host device; a second pin for coupling to receive a second voltage; a third pin for coupling to a configuration control (CC) pin of a USB connector; a VCONN power supply circuit coupled to selectively pass the first voltage to the third pin, the VCONN power supply circuit comprising a first blocking field effect transistor (BFET) coupled in series with a hot-swap field effect transistor (HSFET) between the first pin and the third pin, and a first Zener diode and a second Zener diode coupled anode-to-anode between a source and a gate of the HSFET; a cable detection circuit comprising a second BFET coupled between the second pin and the third pin, and a third Zener diode coupled between a gate of the second BFET and a lower rail; and a power delivery physical layer circuit comprising a receiver and a transmitter, the receiver being coupled to the third pin through a third BFET, the transmitter being coupled to the third pin through a fourth BFET, a fourth Zener diode coupled between a gate of the third BFET and the lower rail and a fifth Zener diode coupled between a gate of the fourth BFET and the lower rail.

In another aspect, an embodiment of a dynamic hot swap keep-off circuit for a hot swap field effect transistor (HSFET) in a VCONN power supply circuit of a Universal Serial Bus (USB) Type-C/Power Delivery (PD) controller chip having a first pin for coupling to a power supply and a second pin for coupling to a CC pin of a USB connector is disclosed. The dynamic hot swap keep-off circuit includes a first Zener diode and a second Zener diode coupled anode-to-anode between a source and a gate of the HSFET; a first P-type metal oxide silicon (PMOS) transistor comprising a source coupled to the source of the HSFET and a drain coupled between the anodes of the first and second Zener diodes; and a second PMOS transistor coupled in series with a third PMOS transistor between the source and the gate of the HSFET.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 5A illustrates a number of signals on the USB controller chip of FIG. 2 during a hard short according to an embodiment of the disclosure;

DETAILED DESCRIPTION

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 2:
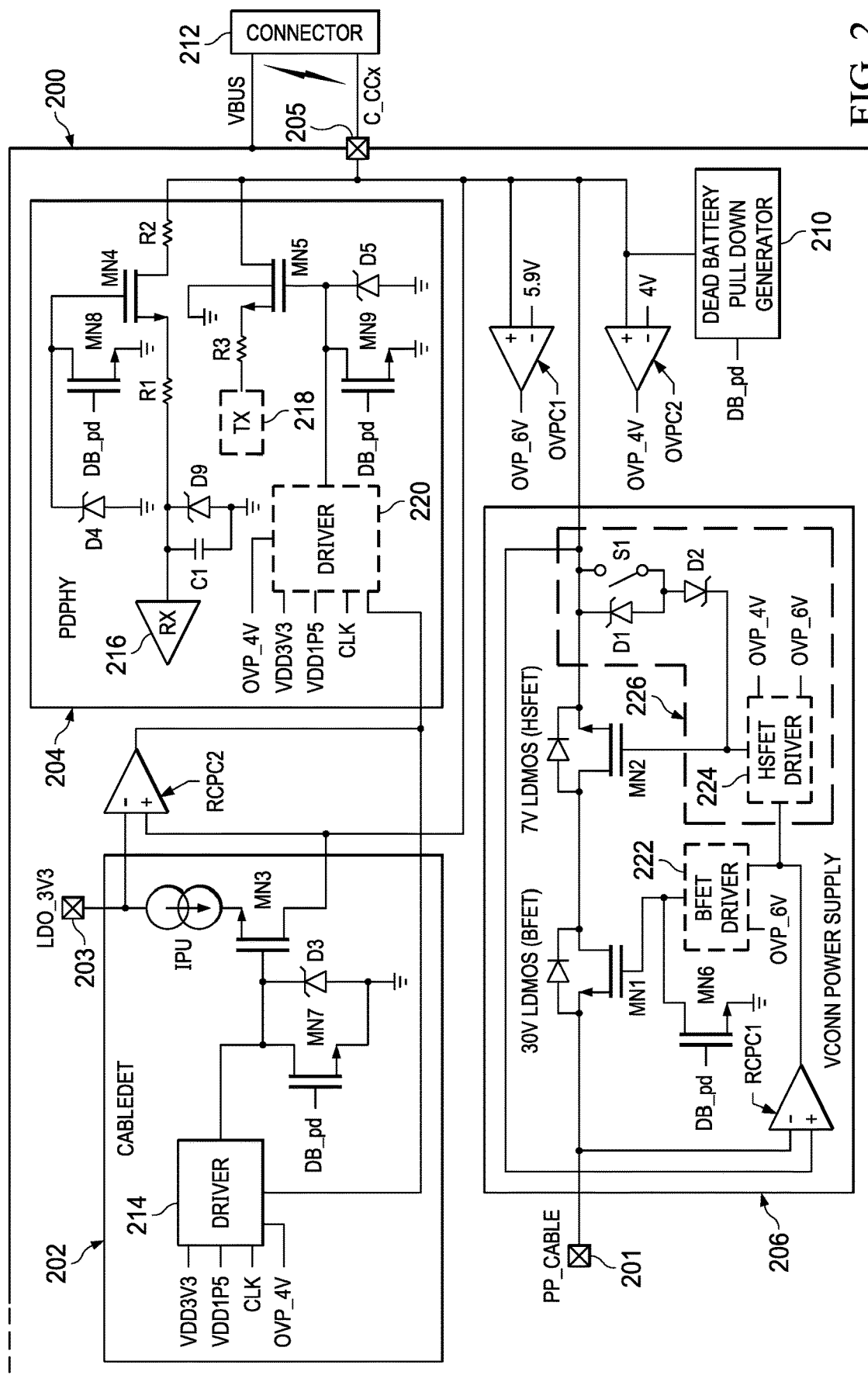
FIG. 2 depicts an implementation of a portion of a USB Type-C/PD controller chip according to an embodiment of the disclosure.

FIG. 2 depicts a portion of a USB Type-C/PD controller chip 200 that contains the circuitry associated with configuration control, which controls the CC line. The configuration control is used for configuring a new connection and can also be used to transfer power to an electronic chip residing inside a USB Type-C cable. In operation, USB Type-C/PD controller chip 200 can be installed in a host device (not specifically shown) that can be any type of electronics that is designed to provide power and possibly data to another device, to receive power and possibly data from another device, or both provide and receive power/data through a USB Type-C cable (not specifically shown). For example, the host device can include but is not limited to a charger, a desktop computer, a laptop computer, a tablet, a mobile telephone, a speaker, a microphone, a keyboard, an e-book reader, a portable multimedia player (PMP), a MP3 player, a mobile medical device, a camera, a wearable device, etc.

In the portion of USB Type-C/PD controller chip 200 shown in FIG. 2, three pins are illustrated: a first pin 201 can be coupled to the host device to receive a first voltage PP_CABLE that in one embodiment can range from 0.9-5.5V; a second pin 203 is coupled to receive a second voltage LDO_3V3, which in one embodiment is 3.3V; the second pin 203 may be coupled either to the host device or to a voltage that is internally generated within USB Type-C/PD controller chip 200; and a third pin 205 can be coupled to the USB connector 212, which can also be referred to as a port, to provide third voltage C_CCx on the CC pin. The elements and operation of cable detection (CABLEDET) circuit 202, power delivery physical layer (PDPHY) circuit 204 and VCONN power supply circuit 206 are explained briefly below, followed by an explanation of the elements of added protection provided by the present disclosure.

VCONN power supply circuit 206 employs back-to-back, common drain, laterally diffused metal oxide silicon (LD-MOS) FETs where a 7V LDMOS MN2 is used as a hot swap FET and a 30V LDMOS MN1 is used as a blocking FET. A common drain structure is chosen because this structure makes it easier to regulate the current during over-current conditions where a first BFET MN1 is used for sensing and HSFET MN2 is regulated. VCONN power supply circuit 206 receives the first voltage PP_CABLE on first pin 201 and passes the first voltage through first BFET MN1 and HSFET MN2 to third pin 205 for delivery to USB connector 212. First BFET MN1 is controlled by BFET driver 222 and HSFET MN2 is controlled by HSFET driver 224, BFET driver 222 and HSFET driver 224 turn first BFET MN1 and HSFET MN2 OFF when the CC line is not being utilized for power delivery.

CABLEDET circuit 202 includes pull-up current source IPU, which is coupled between second pin 203 and third pin 205. A second BFET MN3 is coupled in series between pull-up current source IPU and third pin 205 and is controlled by driver 214 in order to disconnect second pin 203 and pull-up current source IPU from the third pin 205 when cable detection is not needed and when a VBUS to CC line short occurs during operation of CABLEDET circuit 202. Driver 214 receives a number of signals, including VDD3V3, VDD1P5 and clock CLK. CABLEDET circuit 202 can detect the attachment or detachment of a USB cable to a USB connector, e.g., USB connector 212, and can also detect the orientation of the cable, since USB Type C cables are symmetrical as well as reversible end-for-end. Pull-up current source IPU can be controlled to send a fairly precise current having a value, e.g., of 80 µA, 180 µA or 330 µA, towards the CC pin on USB connector 212. Each of these current values advertises a current level that the host device can handle. When a cable is attached to USB connector 212, a voltage created by the advertised current changes, enabling detection of the attachment. A variable resistor in the cable can be utilized to provide a response that indicates the amount of current that the device at the opposite end of the cable can handle. The USB protocol allows USB Type-C/PD controller chip 200 to determine whether the device attached to the opposite end of the cable is a legacy device that can only utilize the 5V charging capabilities of USB 2.0 or whether the device can utilize the power delivery protocols to receive higher voltages.

Power delivery physical layer circuit 204 contains transmitter 218 and receiver 216. First resistor R1, third BFET MN4 and second resistor R2 are coupled in series between receiver 216 and the third pin 205. A first capacitor C1 and a ninth Zener diode D9 are coupled in parallel with each other, with a first terminal of first capacitor C1 and the cathode of ninth diode D9 being coupled to a point between receiver 216 and resistor R1; a second terminal of first capacitor C1 and the anode of ninth diode D9 are coupled to a lower rail, which in one embodiment is the local ground. A third resistor R3 and fourth BFET MN5 are coupled in series between transmitter 218 and the third pin 205. Both third BFET MN4 and fourth BFET MN5 are controlled by driver 220, although only the connection to fourth BFET MN5 is specifically shown herein. Driver 220 also receives signals VDD3V3, VDD1P5 and clock CLK. PDPHY circuit 204 utilizes transmitter 218 and receiver 216 to establish a contract between a host device that contains USB Type-C/PD controller chip 200 and a device on the opposite end of the cable that is also able to utilize power delivery.

The devices that are coupled by a USB Type-C/PD bus can be a simple source for charging a sink, e.g., a charger and a device that needs charging. In other situations, one or both devices can serve as either a source or a sink. For example, in one instance a user may charge their cellular telephone using a USB connection to their personal computer (PC) and in a second instance, use the cellular phone to provide power to the PC. A contract negotiated by the devices can designate the direction of the power transfer and how much power is to be transferred via the USB Type-C/PD cable.

The USB power delivery communication protocol uses Biphase Mark Coding (BMC), which is a differential encoding method that uses the presence or absence of transitions to indicate a logical value. With BMC coding, the receiver does not need to know the polarity of the sent signal since the information is not represented by the absolute voltage levels but by their changes. In other words it does not matter which of the two voltage levels is received, but only whether it is the same or different from the previous one, which makes synchronization easier. The signal sent by PDPHY circuit 204 must be very clean and must pass an eye diagram test, which is used to determine the quality of a signal in the time domain. An example of an eye diagram test for the disclosed circuit is demonstrated later in this application.

The CC line is thus a 5V power and signal multiplexed line. Because of the shared usage of the CC line for both communications and power delivery, it is important not only to protect the low-voltage circuits shown in this figure, but to avoid any interference from VCONN power supply circuit 206 during the operation of CABLEDET circuit 202 and PDPHY circuit 204. In one embodiment, each of BFETs MN1, MN3, MN4, MN5 are 30V LDMOS and HSFET MN2 is a 7V LDMOS. Notably, although the BFETs MN1, MN3, MN4, MN5 are designated as 30V, true 30V transistors would greatly increase both the area and the cost of the disclosed circuit, so these BFETs are only designed to handle 30V on their respective drains. The breakdown voltage between the gate and source of BFETs MN1, MN3, MN4, MN5 is only 5V like the rest of the circuitry shown.

As mentioned previously, the physical proximity of the 5V CC pin in USB connector 212 to the VBUS pin, which can carry a voltage as high as 20V, makes the CC line susceptible to a VBUS short event. A short can typically happen during insertion or ejection of a cable from USB connector 212 and can be caused by contamination at the USB connector pins, a cable that does not meet the specifications, etc. The short can last for hundreds of milliseconds. In the event of a short between the VBUS line and the CC line, all circuits that are connected to the CC pin need to be protected from a high voltage condition that can range up to 30V, because VBUS, which is nominally 20V can see transients up to 28V.

The damage caused by a VBUS to CC short can have multiple results. Because the transistors utilized in the low-voltage circuits of CABLEDET circuit 202, PDPHY circuit 204 and VCONN power supply circuit 206 are only designed to handle 5V, a short can cause the destruction of gate oxides from gate-source voltages that exceed this design. The transistors need to be protected both when the transistors are ON and when the transistors are OFF. Excessive reverse current can also cause device damage. Reverse charging of the input sources represented by voltages PP_CABLE and LDO_3V3, which may be connected to the battery, can cause improper charging of the battery and potentially cause the battery to explode, so any reverse current needs to be minimized. Additionally, the protection provided also needs to be engaged even when the host device has a dead battery, i.e., whether voltages LDO_3V3 and PP_CABLE are floating or zero volts.

Further, the protection provided needs to maintain signal integrity at CC line and cannot interfere with the signal, which is low speed and low voltage, as a miscommunication in the negotiation of power delivery can potentially send excessive power to a device that destroys the device. In particular, the VCONN power path has a drain-source ON resistance (RDSON) of less than 250 mohm in order to provide efficient power delivery. However, this low RDSON can cause a large leakage current when the power path is OFF, which can interfere with the accuracy of the cable detect circuit. This leakage needs to be minimized. Yet another consideration is that during USB PD signal communication, the VCONN path can be unintentionally turned ON and distort CC signal communication. All of these issues must be taken into consideration when designing the protections offered in CABLEDET circuit 202, PDPHY circuit 204 and VCONN power supply circuit 206.

Returning to FIG. 2, 5-6V Zener diodes, which breakdown very quickly in response to excess voltage, are utilized as a first level of protection. In VCONN power supply circuit 206, first Zener diode D1 and second Zener diode D2 are coupled anode-to-anode between the source and gate of HSFET MN2 to ensure that the gate-source voltage does not exceed allowable limits; first Zener diode D1 is further coupled in parallel with a switch S1 between the source of the HSFET MN2 and the anode of second Zener diode D2. Along with HSFET driver 224, Zener diodes D1, D2 and switch S1 form part of a dynamic hot swap keep-off circuit 226 that will be further explained below. In CABLEDET circuit 202, third Zener diode D3 is coupled between the gate of second BFET MN3 and the lower rail and in PDPHY circuit 204, fourth Zener diode D4 is coupled between the gate of third BFET MN4 and the lower rail and fifth Zener diode D5 is coupled between the gate of fourth BFET MN5 and the lower rail. Zener diodes D3, D4, D5 act to pull down the gate respectively of BFETs MN3, MN4, MN5 so that the source is never exposed to the high voltage caused by a "hard short" when the edge rate is greater than 22V/10 ns. Additionally, the dynamic hot swap keep-off circuit 226, of which Zener diodes D1, D2 are a part, provide minimal leakage in the VCONN path when VCONN power supply circuit 206 is OFF.

A second level of protection is provided by two fast reverse current protection comparators RCPC1 and RCPC2. First reverse current protection comparator RCPC1 receives the first voltage PP_CABLE from first pin 201 and the third voltage C_CCx from third pin 205 and compares the two voltages. During cable detection and the negotiations for power deliver, BFET driver 222 and HSFET driver 224 will provide a low signal to first BFET MN1 and HSFET MN2 to hold these two transistors OFF. When VCONN power supply circuit 206 is providing power on the CC pin, the gates of first BFET MN1 and HSFET MN2 are held high to turn the respective transistors ON. When first BFET MN1 and HSFET MN2 are ON, first voltage PP_CABLE should be the same or very slightly greater than third voltage C_CCx due to the very low voltage drop across first BFET MN1 and HSFET MN2. If third voltage C_CCx becomes greater than first voltage PP_CABLE, this condition indicates a short, in which case first reverse current protection comparator RCPC1 sends a first reverse current signal to BFET driver 222 and to HSFET driver 224 that initiates turning OFF first BFET MN1 and HSFET MN2.

Similarly, second reverse current protection comparator RCPC2 receives the second voltage LDO_3V3 from the second pin and the third voltage C_CCx from the third pin 205 and compares the two voltages. BFETs MN3, MN4, MN5 are controlled by drivers 214, 220 to be ON during cable detection and negotiations for power delivery, but will be turned OFF during PP_CABLE to C_CCx power delivery. If third voltage C_CCx becomes greater than second voltage LDO_3V3 while CABLEDET circuit 202 and PDPHY circuit 204 are active, a short is again indicated and second reverse current protection comparator RCPC2 sends a second reverse current signal to drivers 214, 220 that initiates turning OFF BFETs MN3, MN4, MN5. Because of the fast response of reverse current protection comparators RCPC1, RCPC2, the respective drivers are able to turn OFF BFETs MN1, MN3, MN4, MN5 and HSFET MN2 in less than 100 ns and prevent device damage.

When a "soft short" occurs, having an edge rate, for example, less than 22V/100 μs, third voltage C_CCx rises more slowly. This can cause smaller reverse current flows that can pull voltages PP_CABLE and LDO_3V3 along, so that the reverse current protection comparators RCPC1, RCPC2 may not trip. For this possibility, a third level of protection is provided: two over-voltage protection comparators OVPC1, OVPC2 compare third voltage C_CCx against reference voltages that are set with respect to ground and the outputs of over-voltage protection comparators OVPC1, OVPC2 can be utilized to turn OFF BFETS MN1, MN3, MN4, MN5 and HSFET MN2.

At first over-voltage protection comparator OVPC1, third voltage C_CCx is compared to a first reference voltage that can be approximately 6 volts. In one embodiment, the first reference voltage is in the range of 5.9-6.1V. If third voltage C_CCx becomes greater than the first reference voltage, first over-voltage protection comparator OVPC1 sends a first over-voltage signal OVP_6V, which is received by BFET driver 222 and HSFET driver 224 and initiates turning OFF first BFET MN1 and HSFET MN2.

Similarly, at second over-voltage protection comparator OVPC2, third voltage C_CCx is compared to a second reference voltage that in one embodiment is approximately 4 volts. In one embodiment, the second reference voltage is in the range of 3.9-4.1V. If third voltage C_CCx becomes greater than the second reference voltage, second over-voltage protection comparator OVPC2 sends a second over-voltage signal OVP_4V, which is received by drivers 214, 220 and initiates turning OFF BFETs MN3, MN4, MN5. Second over-voltage signal OVP_4V is also received by HSFET driver 224, which utilizes this signal to accurately determine when the CC line is below 4V.

Finally, to ensure that protection is engaged even when the host device has a dead battery and both first voltage PP_CABLE and second voltage LDO_3V3 are zero, a dead-battery pull down generator 210 is provided. Dead-battery pull down generator 210 is coupled to third pin 205 to receive third voltage C_CCx. In the event of a short circuit between the VBUS pin and the CC pin in USB connector 212, dead-battery pull down generator 210 pulls power from third pin 205 and provides a dead-battery pull down signal DB_pd. First dead-battery pull down transistor MN6 is coupled to the gate of first BFET MN1; similarly, second dead-battery pull down transistor MN7, third dead-battery pull down transistor MN8, and fourth dead-battery pull down transistor MN9 are coupled respectively to the gates of BFETs MN3, MN4, MN5. The dead-battery pull down transistors MN6, MN7, MN8, MN9 can pull the gates respectively of BFETs MN1, MN3, MN4, MN5 to the lower rail when a short occurs in the presence of a dead battery on the host device. These multiple levels of protection ensure that a short between VBUS and CC pins on USB connector 212 does not destroy the delicate circuitry provided.

Figure 3:
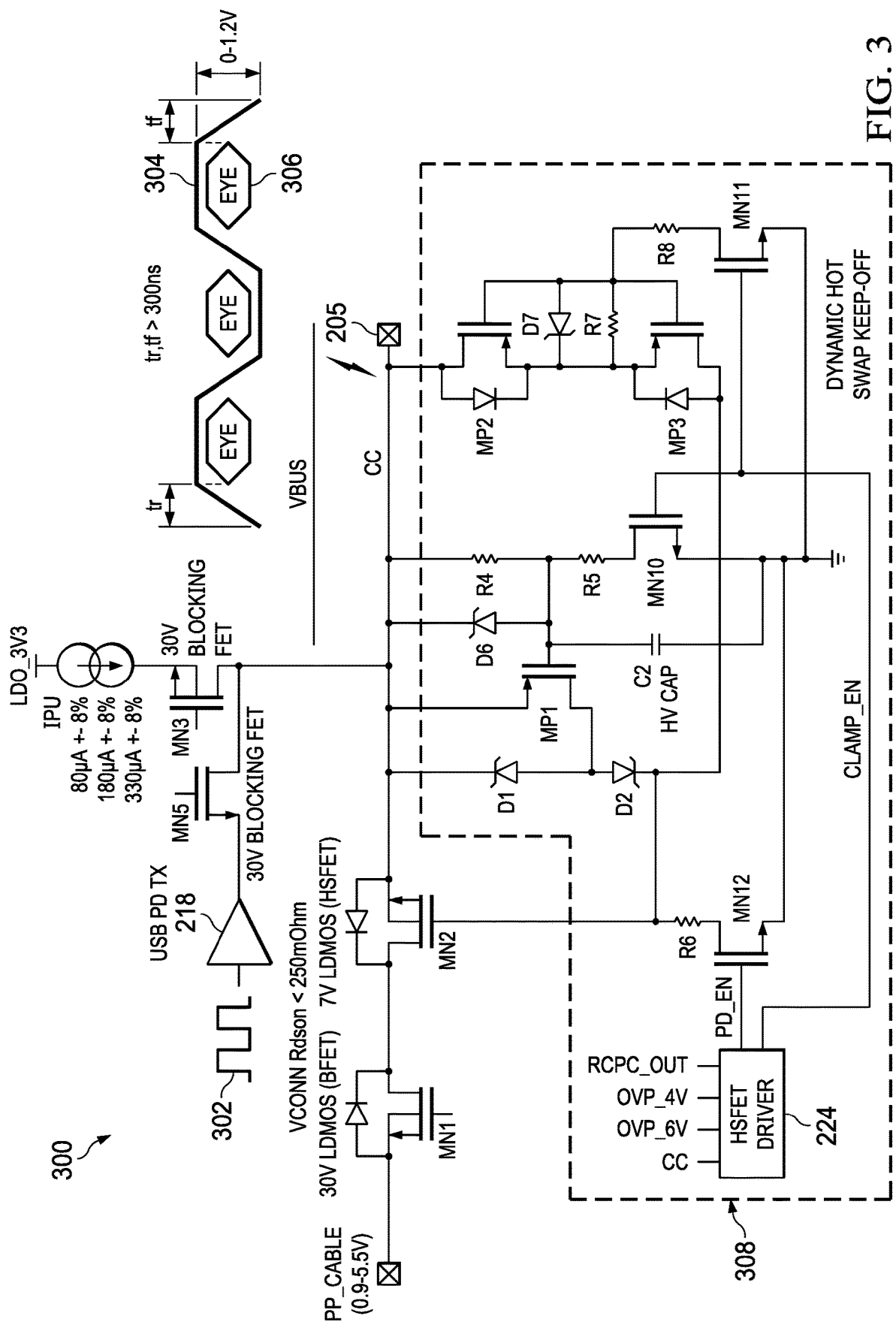
FIG. 3 depicts an implementation of a dynamic hot swap keep-off circuit for an HSFET in a VCONN module of a USB Type-C/PD controller chip according to an embodiment of the disclosure.

Turning next to FIG. 3, circuit 300 shows greater details of the dynamic hot swap keep-off circuit 226 of FIG. 2, as well as some details of the communications signal provided on the CC line. Looking first at the upper portion of this figure, transmitter 218 receives a signal 302 that is sent towards third pin 205 as signal 304, which operates in the range of 0-1.2V. Signal 304 must be shaped to meet USB specifications and cannot touch any portion of eyes 306. To meet these specifications, it is important that the protections added to protect HSFET MN2 does not affect the communications sent on the CC line.

Dynamic hot swap keep-off circuit 308, which can be utilized as the dynamic hot swap keep-off circuit 226 of FIG. 2, includes first and second Zener diodes D1, D2, which as previously mentioned are coupled anode-to-anode between the source and the gate of HSFET MN2 to couple the source and gate of HSFET MN2 in the case of a hard short that needs a quick response. Two other circuits are coupled to supplement the protection of first and second Zener diodes D1 and D2. A first PMOS transistor MP1 is coupled between the source of HSFET MN2 and the anode of second Zener diode D2 and when turned ON will bypass the breakdown voltage of first Zener diode D1. The gate of first PMOS transistor MP1 is coupled to the source of HSFET MN2 through Zener diode D6, which is a third Zener diode within the hot swap keep-off circuit, and to the lower rail through high voltage capacitor C2. First and second resistive elements R4, R5, also referred to as resistors, are coupled in series with first clamp-enable transistor MN10 between the source of HSFET MN2 and the lower rail, while the gate of first PMOS transistor MP1 is further coupled to a point between first and second resistive elements R4 and R5. First clamp-enable transistor MN10 is controlled by a clamp-enable signal CLAMP_EN sent by HSFET driver 224.

A second PMOS transistor MP2 and a third PMOS transistor MP3 are coupled in series between the source and gate of HSFET MN2 to completely bypass Zener diodes D1, D2; second and third PMOS transistors MP2, MP3 share a common source and a common gate. Zener diode D7, which is a fourth Zener diode within the dynamic hot swap keep-off circuit, and third resistive element R7 are coupled in parallel between the common source and the common gate of PMOS transistors MP2, MP3, with Zener diode D7 having an anode coupled to the common gate and a cathode coupled to the common source. Fourth resistive element R8 is coupled in series with second clamp-enable transistor MN11 between the common gate of PMOS transistors MP2, MP3 and the lower rail, with the gate of second clamp-enable transistor MN11 being coupled to receive the clamp-enable signal CLAMP_EN from HSFET driver 224. Finally, fifth resistive element R6 is coupled in series with pull-down enable transistor MN12 between the gate of HSFET MN2 and the lower rail, with the gate of pull-down enable transistor MN12 being controlled by pull-down enable signal PD_EN from HSFET driver 224 to selectively couple the gate of the HSFET to the lower rail. In one embodiment, each of Zener diodes D1, D2, D6, D7 are 5V, first resistive element R4 has a resistance of 4 MΩ, second resistive element R5 has a resistance of 1 MΩ, resistive element R6 has a resistance of 100 KΩ, third resistive element R7 has a resistance of 100 KΩ and fourth resistive element R8 has a resistance of 500 KΩ, while capacitor C2 has a capacitance of 200 fF.

When VCONN power supply circuit 206 is OFF and the voltage on the CC line is less than 4V, the gate of HSFET MN2 is pulled down to ground by using the pull-down enable signal PD_EN to turn ON pull-down enable transistor MN12, ensuring minimal leakage. First PMOS transistor MP1 is OFF; second and third PMOS transistors MP2, MP3 are OFF, pull-down enable signal PD_EN is high and clamp-enable signal CLAMP_EN is low. If the voltage on the CC line rises to between 4V and 5V while VCONN power supply circuit 206 remains OFF, the path through PMOS transistors MP2, MP3 is partially available but not fully enhanced, similarly, the path through first PMOS transistor MP1 and second Zener diode D2 is partially engaged. It can be noted that CC signaling and cable detection happen well below 4V, hence any leakage once the voltage rises above 4V does not cause signal integrity issue. If the voltage on the CC line rises above 5V while VCONN power supply circuit 206 is OFF, the path through first PMOS transistor MP1 and second Zener diode D2 is completely engaged to protect the gate-oxide during any VBUS to CC short event. The path through second and third PMOS transistors MP2, MP3 is also fully enhanced to short the gate-source of HSFET MN2. Pull-down enable signal PD_EN is asserted low and clamp-enable signal CLAMP_EN is asserted high.

During a hard short, whether in the presence of battery power or a dead battery, first PMOS transistor MP1 turns-on due to capacitor C2, and clamps the gate-source voltage (VGS) of HSFET MN2 to approximately the diode drop across second Zener diode D2. Capacitor C2 is sized such that first PMOS transistor MP1 does not turn on during power delivery communication. Under any conditions, the gate-source voltage of HSFET MN2 is never more than the breakdown voltage of first Zener diode D1 plus the diode drop across second Zener diode D2. As will be demonstrated by simulations of the disclosed circuit, this circuit protects HSFET MN2 while providing no interference with communications on the CC line during normal operations.

Figure 1:
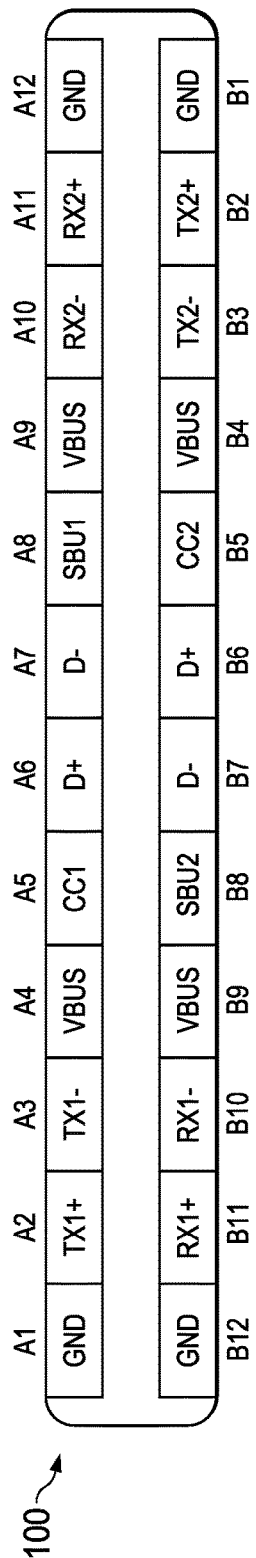
FIG. 1 depicts an example of a USB Type-C/PD connector that can be coupled to a USB controller according to an embodiment of the disclosure.
Figure 4:
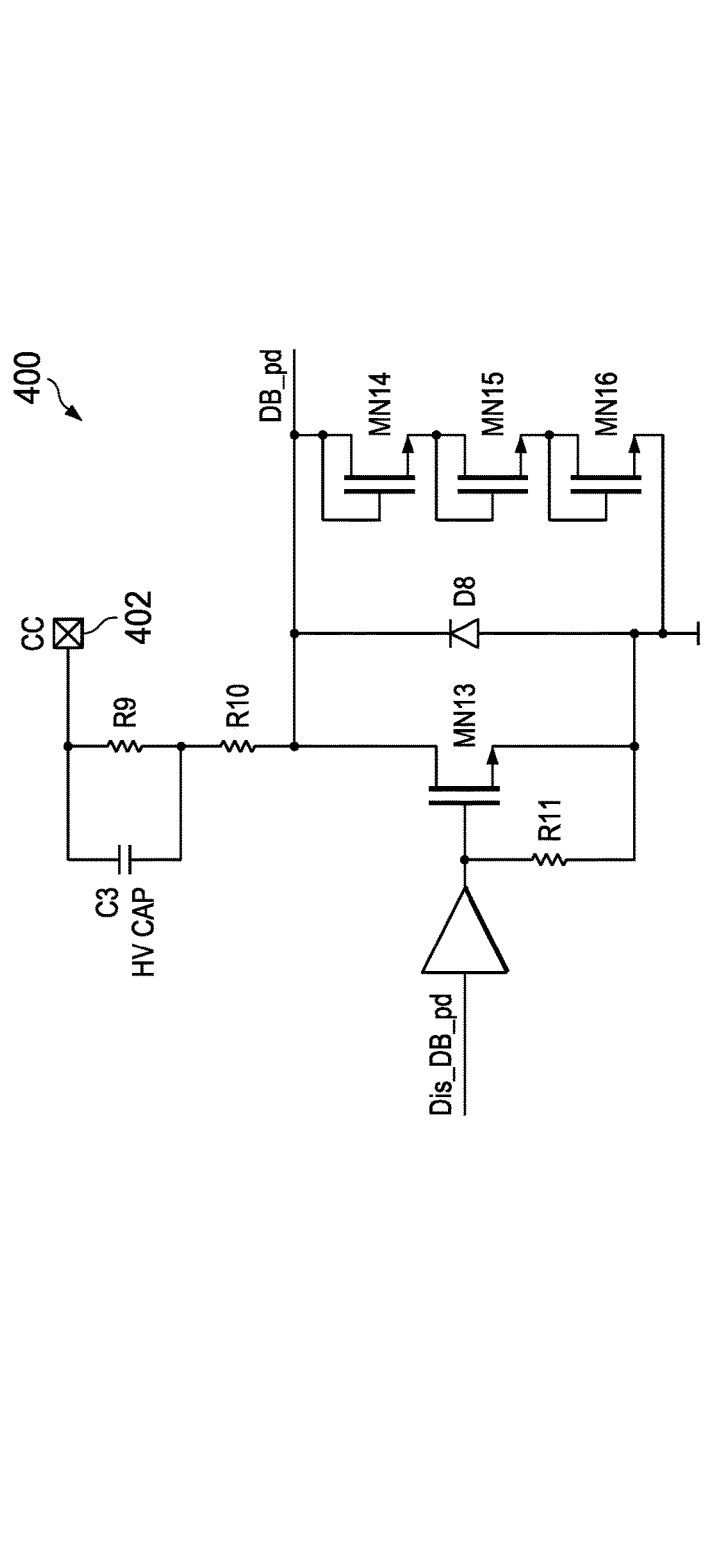
FIG. 4 depicts an implementation of a dead-battery pull down generator that can be utilized with an embodiment of the disclosed USB Type-C/PD controller.

FIG. 4 depicts an example of a dead-battery pull down generator 400 that can be utilized in an embodiment of the disclosure, e.g., as dead-battery pull down generator 210. Although dead-battery pull down generator 400 is not an innovative part of the disclosure, the circuit is shown for completeness. Dead-battery pull down generator 400 includes resistors R9 and R10, which are coupled in series with N-type metal oxide silicon (NMOS) transistor MN13 between the CC pin 402 and the lower rail. High-voltage capacitor C3 is coupled in parallel with resistor R9 between CC pin 402 and resistor R10. Zener diode D8 is coupled in parallel with NMOS transistor MN13 between resistor R10 and the lower rail and NMOS transistors MN14, MN15, MN16 are coupled in series between resistor R10 and the lower rail. A disable dead-battery pull down signal Dis-_DB_pd is provided to the gate of NMOS transistor MN13 and is asserted high when chip power supply is available, so that dead-battery pull down signal DB_pd is pulled low. Resistor R11 is coupled between the gate of NMOS transistor MN13 and the lower rail to pull down the gate of NMOS transistor MN13 when disable-dead-battery pull down signal Dis_DB_pd is not asserted high, so that dead-battery pull down signal DB_pd can then rise to a value of approximately 3V. Dead-battery pull down signal DB_pd is then sufficient to turn ON the gates of dead-battery pull down transistors MN6, MN7, MN8, MN9, which in turn pull down the gates of each of BFETs MN1, MN3, MN4, MN5. In one embodiment, Zener diode D8 is a 5V gate oxide protection diode, resistor R9 has a resistance of 12 MΩ, resistor R10 has a resistance of 20 KΩ, resistor R11 has a resistance of 4 MΩ and capacitor C3 has a capacitance of 200 fF.

FIG. 5A depicts a simulation of a hard short having a ramp rate of 20V/10 ns at USB connector 212 while VCONN power supply circuit 206 is operating. Graphs (a)-(e) provide a number of signals in a stacked format in order to illustrate a common time line. In graph (a), first voltage PP_CABLE and third voltage C_CCx are initially indistinguishable, but at time T1, a hard short occurs and third voltage C_CCx quickly rises to a value of approximately 20V. As seen in graph (b), the output signal from first reverse current protection comparator RCPC1, shown here as RCP1, trips less than 21 ns later. Graph (c) also depicts the first voltage PP_CABLE, but the Y-axis is greatly magnified in order to illustrate the voltage rise that occurs, a rise of less than 0.14V. Graph (d) illustrates that when the short occurs at time T1, a reverse current, i.e. a current having a negative value, begins to flow into C_CCx. Once first reverse current protection comparator RCPC1 has triggered, graph (e) illustrates that the voltage on the gate of first BFET MN1 starts to drop until first BFET MN1 turns OFF at time T2, a duration since the short of less than 50 ns. As desired, the gate of HSFET MN2 rises to follow the third voltage C_CCx, protecting the gate of HSFET MN2, but since first BFET MN1 is OFF, the path through VCONN power supply circuit 206 is turned OFF and the reverse current into C_CCx returns to zero.

Figure 5B:
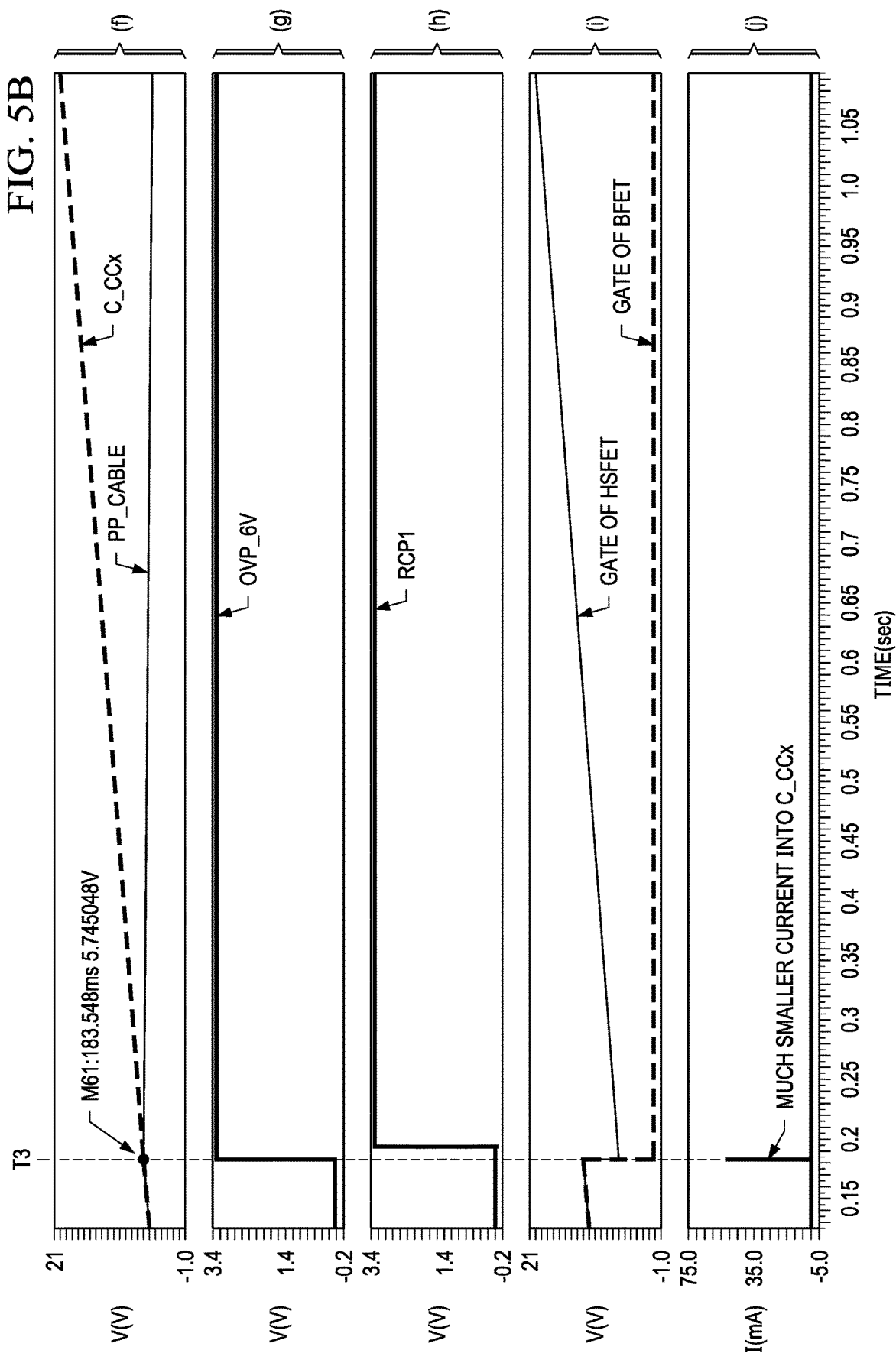
FIG. 5B illustrates a number of signals on the USB controller chip of FIG. 2 during a soft short according to an embodiment of the disclosure.

FIG. 5B depicts a simulation of a soft short having a ramp rate of 20V/1 s at USB connector 212 while the VCONN power supply circuit 206 is operating. Graph (f) again shows first voltage PP_CABLE and third voltage C_CCx running together until a short occurs at time T3, at which point third voltage C_CCx begins to rise. As seen in graph (g), first over-voltage protection comparator OVPC1 trips first and sends first over-voltage signal OVP_6V to BFET driver 222 and HSFET driver 224, so that as seen in graph (i), first BFET MN1 is turned OFF and HSFET MN2 is no longer driven by HSFET driver 224. First reverse current protection comparator RCPC1, seen in graph (h), trips a short time later, after first BFET MN1 has already been turned OFF. As further seen in graph (i), the gates of HSFET MN2 and first BFET MN1 were initially both fully ON. As soon as the short is detected at time T3, the voltage on both gates drops, with the gate of first BFET MN1 dropping to zero while the gate of HSFET MN2 drops at first but then begins to rise to track the voltage on the source of HSFET MN2. Graph (j) illustrates that a much small reverse current occurs very briefly at the time of the short, but is quickly shut OFF.

Figure 6:
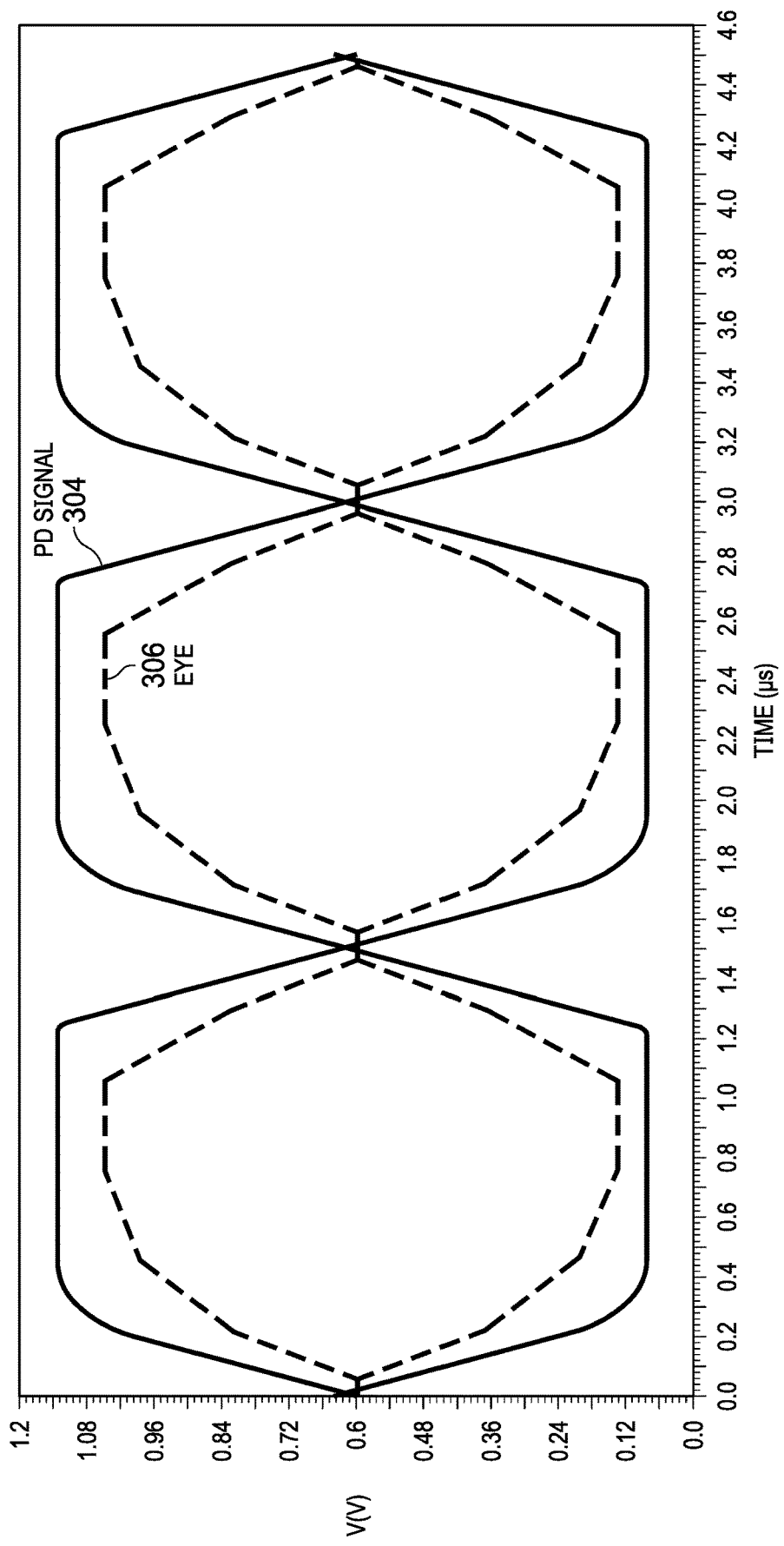
FIG. 6 demonstrates that a communication signal provided by the USB controller chip of FIG. 2 meets the signal requirements of the USB PD specification.

FIG. 6 depicts a simulation of the signal 304 produced by transmitter 218 during power delivery signaling and also illustrates the eye 306 defined by the USB PD specification. According to the USB PD specification, the minimum slew rate is 300 ns and the maximum slew rate is determined by the eye mask. As seen in this figure, there is no degradation in the PD signal transmission due to the protection circuitries disclosed herein.

Figure 7:
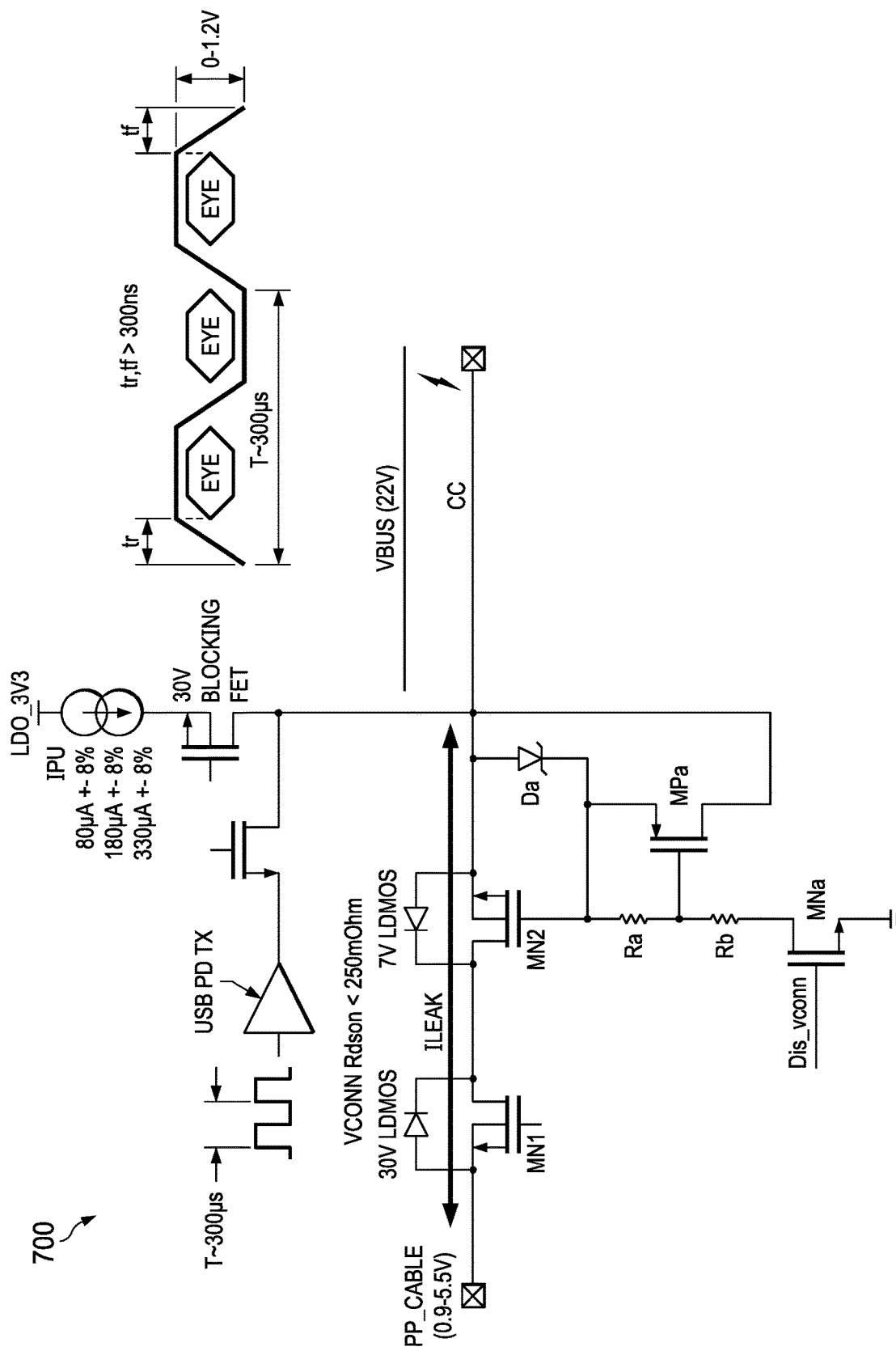
FIG. 7 depicts a circuit that could be considered for use in a USB controller to shut off HSFET MN2, but which does not meet the requirements for communication on the CC line.
Figure 8:
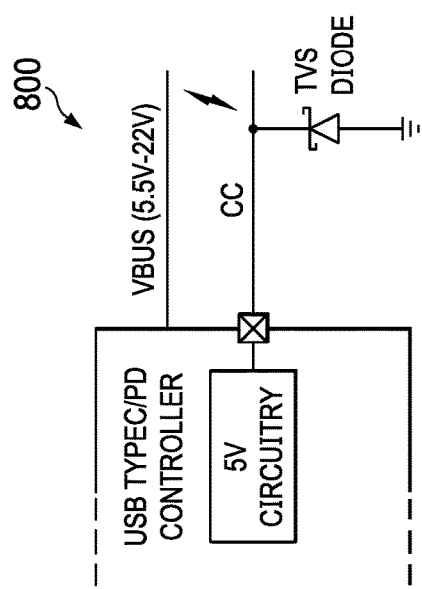
FIG. 8 depicts a protection circuit for the CC pin of an earlier version of a USB controller.
Figure 9:
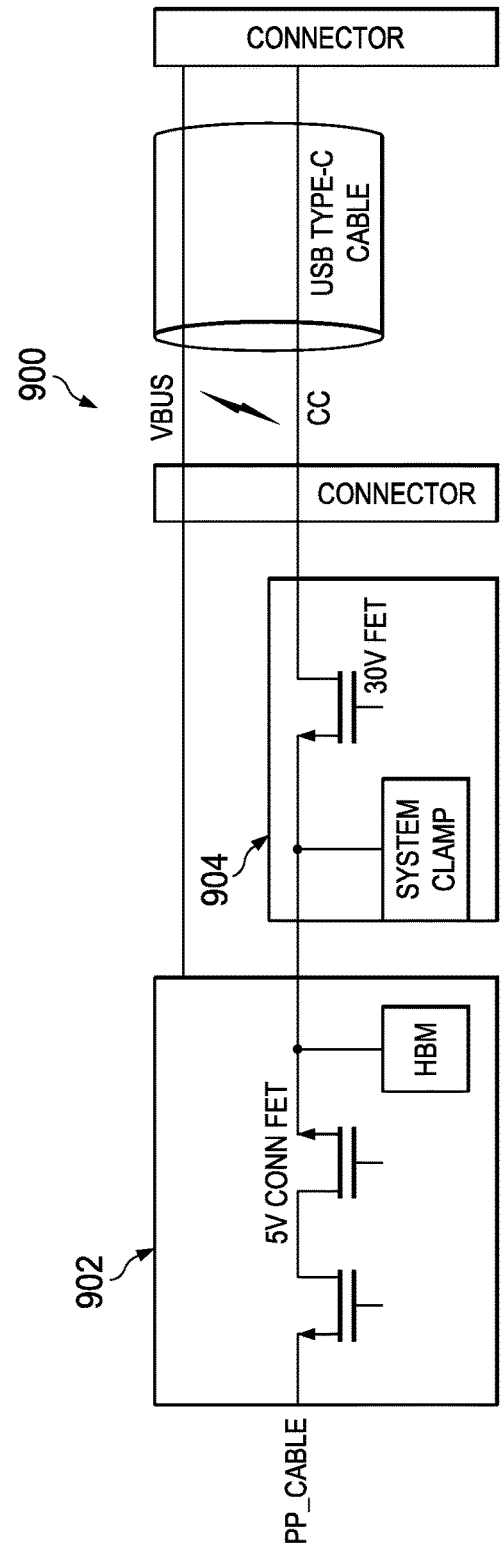
FIG. 9 depicts a protection chip utilized with a USB Type-C/PD controller according to the prior art.

FIGS. 7-9 depict solutions to the same problems that have either been utilized in previous USB controllers or could be considered for such use, but which do not provide both the protection and the lack of interference offered by the disclosed embodiments. These last figures are provided only for comparison and to emphasize the difficulty of achieving the results shown above. In FIG. 7, circuit 700 is aimed at leakage reduction in VCONN power supply circuit 206 and couples resistors Ra and Rb in series with NMOS transistor MNa between the gate of HSFET MN2 and the lower rail; the gate of NMOS transistor MNa is controlled by disable VCONN signal Dis_vconn. Zener diode Da is coupled between the source and gate of HSFET MN2 and PMOS transistor MPa is coupled between the source and gate of HSFET MN2 with the gate of PMOS transistor MPa being controlled by a voltage taken between resistors Ra and Rb.

PMOS transistor MPa is used to short the gate and source of HSFET MN2 when the VCONN power supply circuit 206 is OFF. However, this circuit introduces an extra leakage path via Ra, Rb & MNa. During USB PD communication, especially on a falling edge of the signal, PMOS transistor MPa may turn OFF briefly due to RC delay, and cut-off of PMOS transistor MPa. This may briefly turn ON HSFET MN2 and cause distortion in USB PD signaling. Further, even with a gate-source voltage of 0V, 15-20 uA of leakage current can flow at 125° C. for a 250 mohm power path, which violates the specifications for the current provided by pull-up current source IPU.

FIG. 8 depicts circuit 800, which is directed to providing protection with a transient-voltage-suppression (TVS) diode placed on the CC line. The breakdown voltage (Vbr) of the TVS diode cannot be less than 22V because the duration of the short can be in the order of hundreds of milliseconds, which would otherwise damage the diode itself. As an example, with a VBUS voltage of 22V and a breakdown voltage of 6V, the VBUS to CC short resistance of about 10 mohm implies 9.6 KW peak power dissipation across the diode. Setting the breakdown voltage greater than 22V does not provide any protection to the 5V circuitry connected at CC, so this circuit is not a possible solution.

FIG. 9 depicts system 900, which is also directed at providing VBUS to CC short protection, but using an external chip. Chip 902 is an early version of a USB Type-C/PD chip that did not include the disclosed short protection. In order to provide the necessary protection, the user needs to install a second chip 904 that included a 30V FET between USB Type-C/PD chip 902 and the USB connector. The 30V FET is used as a blocking FET that is opened whenever a high-voltage condition is detected at a CCx pin. A fast turn-off of the protection FET in chip 904 and the system clamp ensure that transients at the CC pin of controller chip 902 is at worst like a human body model electrostatic discharge event. While the solution of system 900 works to protect the USB Type-C/PD chip 902, the limitations of this solution include the additional resistance in the VCONN path due to the additional 30V FET in series with the path, additional cost and printed circuit board (PCB) complexity due to the add-on protection chip, and the additional quiescent current of chip 904. These limitations are reduced or eliminated by the present solution.

With the emergence of USB Type-C/PD controllers and cables, users need to know that they are not connecting devices or cables that will damage existing electronic equipment and it is important to provide robust protection to prevent such damage. The disclosed embodiments provide the necessary robust protection against VBUS to CC shorts while providing an improved RDSON and reducing system level quiescent current. Cost is also reduced by removing the requirement for a separate protection chip and corresponding passive PCB components. The disclosed layers of protection offer a solution that overcomes the shortcomings of the devices and systems of FIGS. 7-9.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A controller chip comprising:
   a VCONN power supply circuit having an input and an output, the VCONN power supply circuit including:
   a first transistor having a first terminal coupled to the input, having a second terminal, and having a control terminal;
   a second transistor having a first terminal coupled to the first transistor second terminal, having a second terminal coupled to the output, and having a control terminal;
   a first Zener diode having a cathode coupled to the second transistor second terminal and having an anode; and
   a second Zener diode having an anode coupled to the first Zener diode anode and a cathode coupled to the second transistor control terminal;
   a cable detection circuit having an input and an output, the cable detection circuit including:
   a first current source having a first terminal coupled to the input and a second terminal;
   a third transistor having a first terminal coupled to the first current source second terminal, having a second terminal coupled to the output, and having a control terminal; and a first driver circuit having a driver output coupled to the second blocking third transistor control input; and a power delivery physical layer circuit having an input and an output, the power delivery physical layer circuit including:
 a receiver circuit having an input coupled to the input of the power delivery physical layer circuit;
 a transmitter circuit having an output coupled to the input of the power delivery physical layer circuit.

2. The controller chip of claim 1 in which the output of the VCONN power supply circuit is adapted to be coupled to a CC pin of a USB connector, the USB connector having a VBUS pin next to the CC pin, the VBUS pin being adapted to supply up to 20 volts and the CC pin being adapted to supply up to 5 volts.

3. The controller chip of claim 1 in which the first and third transistors are laterally diffused metal oxide silicon transistors designed to handle 30 volts on their respective drains and having a breakdown voltage between the gate and source of 5 volts, and in which the second transistor is a 7 volt laterally diffused metal oxide silicon transistor.

4. The controller chip of claim 1 including:
 a fourth transistor coupling the first transistor control input to a voltage lower than a voltage on the output of the VCONN power supply circuit; and
 a fifth transistor coupling the third transistor control input to the voltage lower than the voltage on the output of the VCONN power supply circuit.

5. A controller chip comprising:
 a VCONN power supply circuit having an input and an output, the VCONN power supply circuit including:
 a first transistor having a first terminal coupled to the input of the VCONN power supply circuit, having a second terminal, and having a control terminal;
 a second transistor having a first terminal coupled to the first transistor second terminal, having a second terminal coupled to the output of the VCONN power supply circuit, and having a control input;
 a cable detection circuit having an input and an output, the cable detection circuit including:
 a third transistor having a first terminal coupled to the input of the cable detection circuit, having a second terminal coupled to the output of the VCONN power supply circuit, and having a control input; and
 a first Zener diode coupled between the third transistor control input and a voltage; and
 a power delivery physical layer circuit including:
 a receiver circuit having an input; and
 a transmitter circuit having an output.

6. The controller chip of claim 5 in which the output of the VCONN power supply circuit is adapted to be coupled to a CC pin of a USB connector, the USB connector having a VBUS pin next to the CC pin, the VBUS pin being adapted to supply up to 20 volts and the CC pin being adapted to supply up to 5 volts.

7. The controller chip of claim 5 in which the first and third transistors are laterally diffused metal oxide silicon transistors designed to handle 30 volts on their respective drains and having a breakdown voltage between the gate and source of 5 volts, and in which the second transistor is a 7 volt laterally diffused metal oxide silicon transistor.

8. The controller chip of claim 5 including:
 a fourth transistor coupling the first transistor control input to a voltage lower than a voltage on the output of the VCONN power supply circuit; and
 a fifth transistor coupling the third transistor control input to the the voltage lower than the voltage on the output of the VCONN power supply circuit.

9. A controller chip comprising:
 a VCONN power supply circuit having an input and an output, the VCONN power supply circuit including:
 a first transistor having a first terminal coupled to the input of the VCONN power supply circuit, having a second terminal, and having a control terminal;
 a second transistor having a first terminal coupled to the first transistor second terminal, having a second terminal coupled to the output of the VCONN power supply circuit, and having a control input;
 a cable detection circuit having an input and an output, the cable detection circuit including:
 a pull-up current source having a first terminal coupled to the input of the cable detection circuit and a second terminal;
 a third transistor having a first terminal coupled to the pull-up current source second terminal, having a second terminal coupled to the output of the cable detection circuit, and having a control input; and
 a first driver circuit having a driver output coupled to the third transistor control input; and
 a power delivery physical layer circuit including:
 a receiver having an input;
 a fourth transistor having a first terminal coupled to the receiver input, having a second terminal coupled to the output of the VCONN power supply circuit, and having a control input;
 a first Zener diode coupled between the fourth transistor control input and a voltage;
 a transmitter having an output;
 a fifth transistor having a first terminal coupled to the transmitter output, having a second terminal coupled to the output of the VCONN power supply circuit, and having a control input; and
 a second Zener diode coupled between the fifth transistor control input and the voltage.

10. The controller chip of claim 9 in which the output of the VCONN power supply circuit is adapted to be coupled to a CC pin of a USB connector, the USB connector having a VBUS pin next to the CC pin, the VBUS pin being adapted to supply up to 20 volts and the CC pin being adapted to supply up to 5 volts.

11. The controller chip of claim 9 in which the first, third, fourth and fifth transistors are laterally diffused metal oxide silicon transistors designed to handle 30 volts on their respective drains and having a breakdown voltage between the gate and source of 5 volts, and in which the second transistor is a 7 volt laterally diffused metal oxide silicon transistor.

12. The USB Type-C/PD controller chip of claim 9 including:
 a fourth transistor coupling the first transistor control input to a voltage lower than a voltage on the output of the VCONN power supply circuit; and
 a fifth transistor coupling the third transistor control input to the the voltage lower than the voltage on the output of the VCONN power supply circuit.

13. A controller chip comprising:
 a VCONN power supply circuit having an input and an output, the VCONN power supply circuit including:
 a first transistor having a first terminal coupled to the input, having a second terminal, and having a control terminal;

a second transistor having a first terminal coupled to the first transistor second terminal, having a second terminal coupled to the output, and having a control terminal;
a first Zener diode having a cathode coupled to the second transistor second terminal and having an anode; and
a second Zener diode having an anode coupled to the first Zener diode anode and a cathode coupled to the second transistor control terminal;
a cable detection circuit having an input and an output, the cable detection circuit including:
  a third transistor having a first terminal coupled to the input of the cable detection circuit, having a second terminal coupled to the output of the cable detection circuit, and having a control input; and
  a third Zener diode coupled between the third transistor control input and a lower rail voltage; and
a power delivery physical layer circuit including:
  a receiver having an input; and
  a transmitter having an output.

14. The controller chip of claim 13 in which the output of the VCONN power supply circuit is adapted to be coupled to a CC pin of a USB connector, the USB connector having a VBUS pin next to the CC pin, the VBUS pin being adapted to supply up to 20 volts and the CC pin being adapted to supply up to 5 volts.

15. The controller chip of claim 13 in which the first and third transistors are laterally diffused metal oxide silicon transistors designed to handle 30 volts on their respective drains and having a breakdown voltage between the gate and source of 5 volts, and in which the second transistor is a 7 volt laterally diffused metal oxide silicon transistor.

16. The controller chip of claim 13 including:
(a) fourth transistor coupling the first transistor control input to a voltage lower than a voltage on the output of the VCONN power supply circuit; and
(b) a fifth transistor coupling the third transistor control input to the voltage lower than the voltage on the output of the VCONN power supply circuit.

\* \* \* \* \*